United States Patent
Kim

(10) Patent No.: US 10,276,086 B2
(45) Date of Patent: Apr. 30, 2019

(54) CHIP ON FILM CIRCUIT BOARD FOR REDUCING ELECTROMAGNETIC INTERFERENCE AND DISPLAY DEVICE HAVING THE SAME

(71) Applicant: Samsung Electronics Co., Ltd., Suwon-si, Gyeonggi-do (KR)

(72) Inventor: Min Sung Kim, Incheon (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 205 days.

(21) Appl. No.: 15/236,838

(22) Filed: Aug. 15, 2016

(65) Prior Publication Data

US 2017/0061859 A1 Mar. 2, 2017

(30) Foreign Application Priority Data

Aug. 26, 2015 (KR) .................. 10-2015-0120140

(51) Int. Cl.
*G09G 3/20* (2006.01)
*H01L 23/498* (2006.01)
*H01L 23/00* (2006.01)

(52) U.S. Cl.
CPC ....... *G09G 3/2092* (2013.01); *H01L 23/4985* (2013.01); *H01L 23/49838* (2013.01); *H01L 24/16* (2013.01); *G09G 2300/0426* (2013.01); *G09G 2330/06* (2013.01); *H01L 2224/16227* (2013.01)

(58) Field of Classification Search
USPC .................................. 361/748, 749
See application file for complete search history.

(56) References Cited

U.S. PATENT DOCUMENTS

| | | | |
|---|---|---|---|
| 6,590,551 B1* | 7/2003 | Kim | G09G 3/3677 345/100 |
| 7,994,871 B2 | 8/2011 | Chen et al. | |
| 8,179,495 B2 | 5/2012 | Hsu et al. | |
| 8,754,332 B2* | 6/2014 | Sumida | G02F 1/13452 174/254 |
| 2012/0266463 A1 | 10/2012 | Lee et al. | |

FOREIGN PATENT DOCUMENTS

| | | |
|---|---|---|
| JP | 2003158351 A | 5/2003 |
| JP | 2006100664 A | 4/2006 |
| JP | 2007086627 A | 4/2007 |
| KR | 100623724 B1 | 9/2006 |
| KR | 10-0859804 B1 | 9/2008 |
| KR | 20120076968 A | 7/2012 |

* cited by examiner

*Primary Examiner* — Andargie M Aychillhum
(74) *Attorney, Agent, or Firm* — Harness, Dickey & Pierce, P.L.C.

(57) ABSTRACT

A chip on film circuit board is provided. The chip on film circuit board includes a film circuit board configured to include a first edge and a second edge each extending in a first direction, and a source driver IC configured to be connected to a plurality of voltage lines placed on the film circuit board, in which a ratio of an area in which the plurality of voltage lines are placed to a film area of the film circuit board is about 0.7 or greater and about 0.996 or less.

17 Claims, 6 Drawing Sheets

CHIP ON FILM CIRCUIT BOARD FOR REDUCING ELECTROMAGNETIC INTERFERENCE AND DISPLAY DEVICE HAVING THE SAME

CROSS-REFERENCE TO RELATED APPLICATION

This application claims priority under 35 U.S.C. § 119 from Korean Patent Application No. 10-2015-0120140, filed on Aug. 26, 2015, the disclosure of which is hereby incorporated by reference in its entirety.

BACKGROUND

Example embodiments of the inventive concepts relate to a chip on film circuit board, and more particularly to a film circuit board for reducing electromagnetic interference and/ or to a display device having the same.

In recent years, display panels are getting larger in size, and display driver integrated circuits (IC), which drives the display panels, are getting smaller in size and integrated. Methods of connecting a display panel and a printed circuit board (PCB) includes a chip on film (COF) method and a chip on glass (COG) method.

The COF method is a method of mounting a semiconductor chip on a flexible printed circuit (FPC), and is a new type of package developed towards making communication devices thin, light, short, and small. An electromagnetic wave is generated in a source driver IC due to a current flow, and the generated electromagnetic wave generates an electromagnetic interference (EMI). Since the EMI typically causes malfunction of an electronic device, it may be advantageous to reduce the EMI.

SUMMARY

An example embodiment of the inventive concepts is directed to a chip on film circuit board, including a film circuit board which includes a first edge and a second edge each extending in a first direction, and a source driver IC connected to a plurality of voltage lines placed on the film circuit board, in which a ratio of an area in which the plurality of voltage lines are placed to a film area of the film circuit board is about 0.7 or greater, and about 0.996 or less. A wiring width of each of some of the plurality of voltage lines may be 200 µm≤W≤230 µm.

The source driver IC may include a control logic, a data processing interface which processes data according to a control of the control logic, and an output circuit which outputs data processed by the data processing interface to a display panel, in which a first voltage line among the voltage lines supplies a first operational voltage to the control logic, a second voltage line among the voltage lines supplies a second operational voltage to the output circuit, and a third voltage line among the voltage lines supplies a third operational voltage to the data processing interface. In example embodiments, a magnitude of the first operational voltage is smaller than a magnitude of the second operational voltage, and a magnitude of the third operational voltage is equal to that of the first operational voltage.

The chip on film circuit board further includes a first ground line which supplies a ground voltage to the control logic circuit and the data processing interface, and a second ground line which supplies the ground voltage to the output circuit, in which a wiring width of the first ground line and a wiring width of the second ground line are uneven.

The chip on film circuit board further includes a first ground line which supplies a ground voltage to the control logic circuit and the data processing interface, and a second ground line which supplies the ground voltage to the output circuit, in which a terminal portion of a wiring width of the first ground line is the largest, and a terminal portion of a wiring width of the second ground line is the largest. The chip on film circuit board further includes a plurality of voids which are arranged at regular intervals between each of the plurality of voltage lines and a film of the film circuit board.

Each of the plurality of voltage lines further includes a third edge and a fourth edge which are parallel to each other, and a distance between each of voids that are closest to the third edge or the fourth edge is about 60 µm or less.

The chip on film circuit board further includes a first bump which connects the source driver IC and the film circuit board, and the first bump is connected to one of the plurality of voltage lines through at least two paths. The chip on film circuit board further includes a second bump which connects the source driver IC and the film circuit board, and the first bump and the second bump are electrically connected to each other through a path.

An example embodiment of the inventive concepts is directed to a display device, including a display panel and a chip on film circuit board which is connected to the display panel, in which the chip on film circuit board includes a film circuit board and a source drive IC which is connected to a plurality of voltage lines placed on the film circuit board and drives pixels included in the display panel. The ratio of an area including the plurality of voltage lines to a film area of the film circuit board is about 0.7 or greater and about 0.996 or less. A wiring width of each of some of the plurality of voltage lines is 200 µm≤W≤230 µm.

BRIEF DESCRIPTION OF THE DRAWINGS

These and/or other example inventive concepts will become apparent and more readily appreciated from the following description of the example embodiments, taken in conjunction with the accompanying drawings of which.

DETAILED DESCRIPTION

Figure 1:
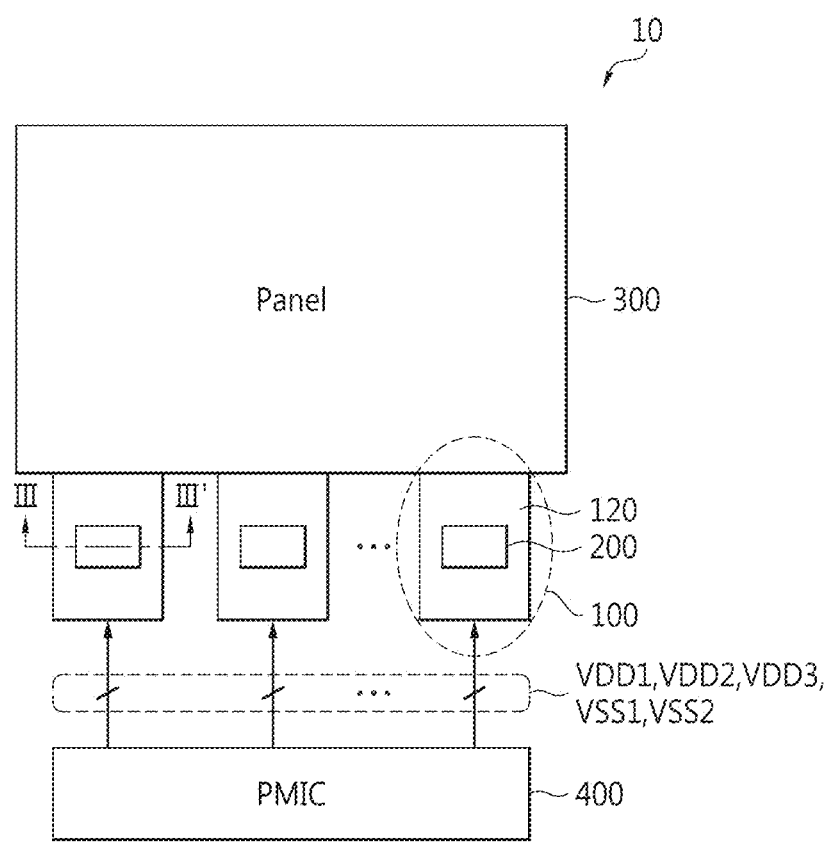
FIG. 1 is a block diagram of a display device according to an example embodiment of the inventive concepts.

Reference will now be made in detail to the example embodiments of inventive concepts, examples of which are illustrated in the accompanying drawings, wherein like reference numerals refer to the like elements throughout. The example embodiments are described below in order to explain the inventive concepts by referring to the figures.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram of a display device according to an example embodiment of the inventive concepts. Referring to FIG. 1, a display device 10 may include a plurality of chip on film circuit boards 100, a display panel 300, and a power management integrated circuit (PMIC) 400. The display device 10 may be embodied or housed, for example, in a personal computer (PC) or a mobile device. The mobile device may be embodied or housed, for example, in a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, a drone, an e-book, or like devices.

Each of the chip on film circuit board 100 may receive a plurality of voltages VDD1, VDD2, VDD3, VSS1, and VSS2 output from the PMIC 400, and drive the display panel 300 using the plurality of voltages VDD1, VDD2, VDD3, VSS1, and VSS2. The chip on film circuit board 100 may include a film circuit board 120, a plurality of bumps, and a source driver IC 200. The film circuit board 120 may be embodied or housed, for example, in a FPC. The plurality of bumps may connect the film circuit board 120 and the source driver IC 200. The chip on film circuit board 100 may be a chip on film (COF) package.

According to example embodiments of the inventive concepts, the number of the chip on film circuit boards 100 included in the display device 10 may be variously changed. For example, the number of the chip on film circuit boards 100 may be variously changed according to the number of pixels included in the display panel 300.

The display panel 300 may receive a plurality of voltages and data output from the source driver ICs 200 and display an image corresponding to the data.

The PMIC 400 may transmit the plurality of voltages VDD1, VDD2, VDD3, VSS1, and VSS2 to the chip on circuit board 100. The plurality of voltages VDD1, VDD2, VDD3, VSS1, and VSS2 may include a first operational voltage VDD1, a second operational voltage VDD2, a third operational voltage VDD3, a first ground voltage VSS1, and a second ground voltage VSS2.

The first operational voltage VDD1 may be equal to or different from the third operational voltage VDD3 in magnitude. A ground voltage paired with each of the first operational voltage VDD1 and the third operational voltage VDD3 may be the first ground voltage VSS1.

Figure 2:
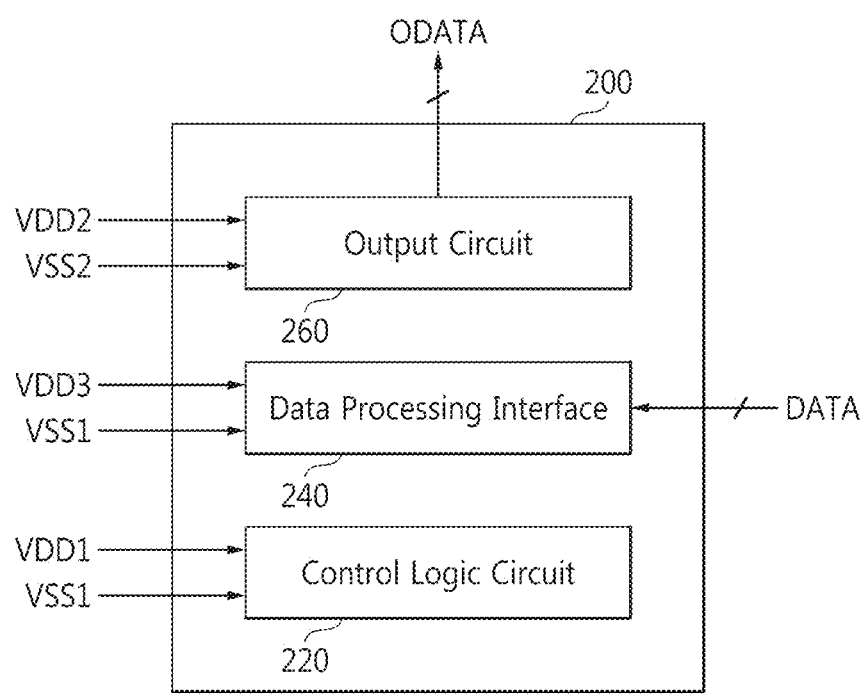
FIG. 2 is a specific block diagram of a source driver IC illustrated in FIG. 1.

FIG. 2 is an example block diagram of the source driver IC illustrated in FIG. 1. Referring to FIGS. 1 and 2, the source driver IC 200 may transmit signals and voltages for displaying an image corresponding to image data to the display panel 300.

The source driver IC 200 may include a control logic circuit 220, a data processing interface 240, and an output circuit 260.

The control logic circuit 220 may generate control signals for controlling an operation of the source driver IC 200 based on the first operational voltage VDD1 and the first ground voltage VSS1.

The data processing interface 240 may process data DATA and transmit the processed data to the output circuit 260 based on the third operational voltage VDD3 and the first ground voltage VSS1. An operation of the data processing interface 240 may be controlled by the control logic circuit 220.

The output circuit 260 may output data converted by the data processing interface 240 to the display panel 300 based on the second operational voltage VDD2 and the second ground voltage VSS2. An operation of the output circuit 260 may be controlled by the control logic circuit 220.

Figure 3:
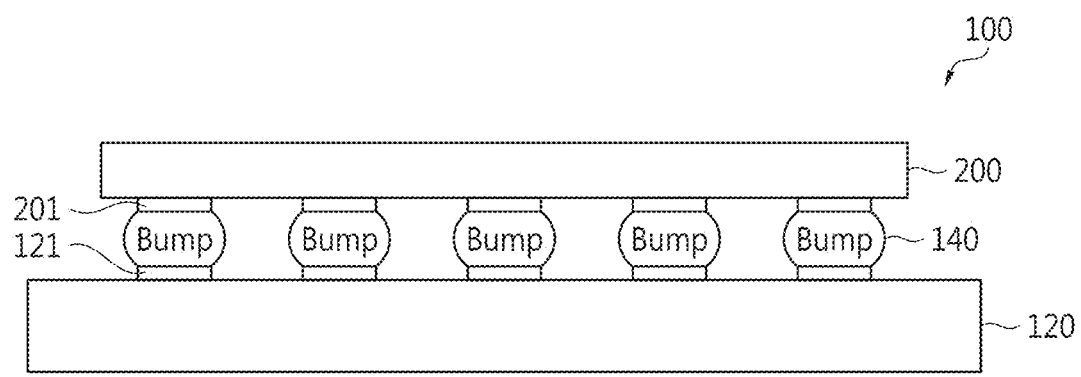
FIG. 3 is a cross-sectional view of a chip on film circuit board illustrated in FIG. 1 taken along in the III-III' direction.

FIG. 3 is across-sectional view of the chip on film circuit board illustrated in FIG. 1 taken along in the direction. The film circuit board 120 included in the chip on film circuit board 100 may be connected to the source driver IC 200 through bumps 140.

The source driver IC 200 may include source pads 201, and the film circuit board 120 may include film pads 121. The bumps 140 may be located between source pads 201 and film pads 121, and connect the source pads 201 and the film pads 121. The film pads 121 may be connected to a plurality of voltage lines placed in the film circuit board 120. A plurality of voltage lines formed on the film circuit board 120 may supply voltages to the source driver IC 200 through the bumps 140.

Figure 4:
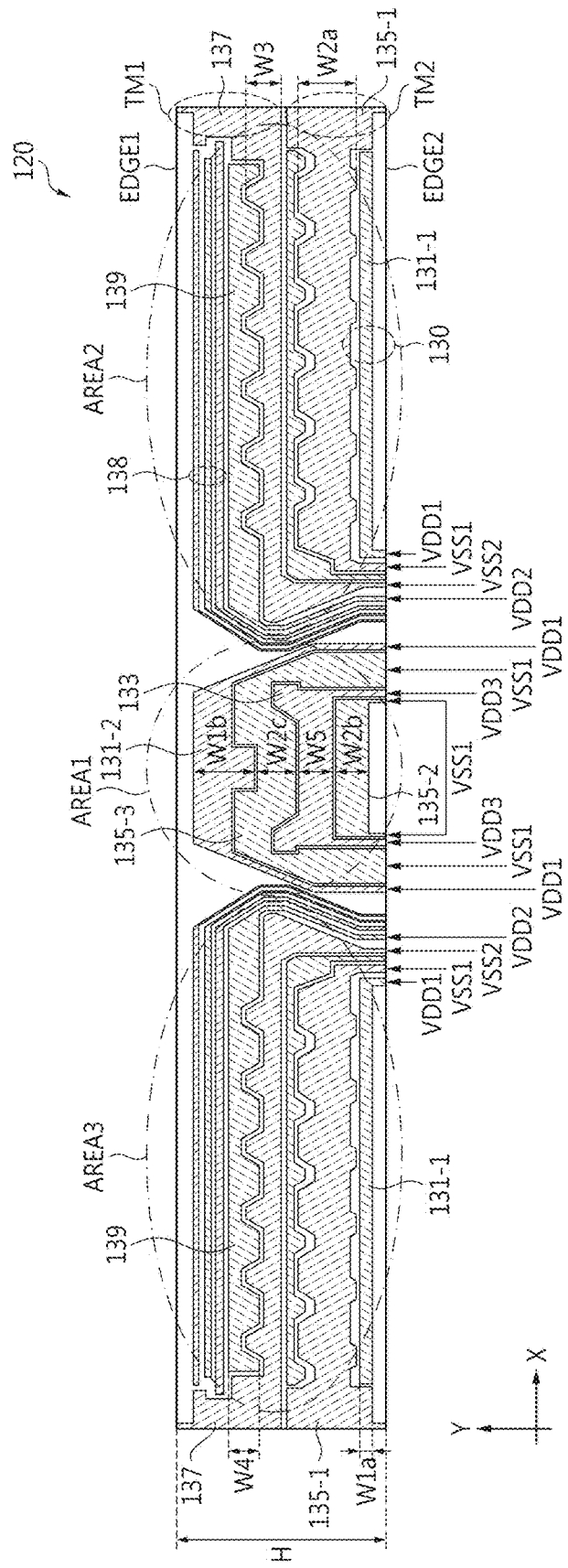
FIG. 4 is a plan view of a film circuit board illustrated in FIG. 1.

FIG. 4 is a plan view of the film circuit board illustrated in FIG. 1. Referring to FIGS. 1 and 4, the film circuit board 120 has a second region AREA2 and a third region AREA3 which are configured to be symmetrical with respect to a first region AREA1. Accordingly, the second region AREA2 and the third region AREA3 may be structurally the same as or similar to each other.

An X-axis represents a first direction and a Y-axis represents a second direction in FIG. 4. The film circuit board 120 may include a first edge EDGE1 and a second edge EDGE2, each extending in a first X direction. The first edge EDGE1 and the second edge EDGE2 may generally be substantially parallel to each other, but may be less than parallel in one or more parts, and a wiring width of each of the plurality of voltage lines may be partially varied.

The plurality of voltage lines 131-1, 131-2, 133, 135-1, 135-2, 135-3, 137 and 139 may be formed on the film circuit board 120. The plurality of voltage lines 131-1, 131-2, 133, 135-1, 135-2, 135-3, 137 and 139 may be formed between the first edge EDGE1 and the second edge EDGE2. The film circuit board 120 may transmit the plurality of voltages VDD1, VDD2, VDD3, VSS1, and VSS2 to the source driver IC 120 through the plurality of voltage lines 131-1, 131-2, 133, 135-1, 135-2, 135-3, 137 and 139.

In various example embodiments, a first voltage line 131-1 and a second voltage line 131-2 transmit the first operational voltage VDD1, an eighth voltage line 139 transmits the second operational voltage VDD2, a third voltage line 133 transmits the third operational voltage VDD3, a fourth voltage line 135-1, a fifth voltage line 135-2, and a sixth voltage line 135-3 transmit the first ground voltage VSS1, and a seventh voltage line 137 transmits the second ground voltage VSS2.

The second voltage line 131-2, the third voltage line 133, the fifth voltage line 135-2, and the sixth voltage line 135-3 may be placed in the first region AREA1. The second voltage line 131-2 may be placed closest to the first edge EDGE1, and the fifth voltage line 135-2 may be placed closest to the second edge EDGE2. Moreover, the third voltage line 133 may be placed between the sixth voltage line 135-3 and the fifth voltage line 135-2, and the sixth voltage line 135-3 may be placed between the second voltage line 131-2 and the third voltage line 133.

A placement order of the second voltage line 131-2, the third voltage line 133, the fifth voltage line 135-2, and the sixth voltage line 135-3 is not limited thereto. A placement order of the plurality of voltage lines 131-2, 133, 135-2, and 135-3 included in the first region AREA1 may be variously changed according to example embodiments.

Each or at least one of the second region AREA2 and the third region AREA3 may include the first voltage line 131-1, the eighth voltage line 139, the fourth voltage line 135-1, and the seventh voltage line 137. Each or at least one eighth voltage line 139 may be placed closest to the first edge EDGE1, and each or at least one first voltage line 131-1 may be placed closest to the second edge EDGE2. In addition, the seventh voltage line 137 may be placed between the eighth voltage line 139 and the first voltage line 131-1, and the fourth voltage line 135-1 may be placed between the first voltage line 131-1 and the seventh voltage line 137.

In various example embodiments, the placement order of the first voltage line 131-1, the eighth voltage line 139, the fourth voltage line 135-1, and the seventh voltage line 137 is not limited to the above-discussed configuration. That is, a placement order of the plurality of voltage lines 131-1, 135-1, 137, and 139 included in each of the second region AREA2 and the third region AREA3 may be variously changed according to example embodiments. The fifth voltage line 135-2, the sixth voltage line 135-3, the second voltage line 131-2, and the third voltage line 133 may be placed in the first region AREA1.

The first voltage line 131-1, the fourth voltage line 135-1, the seventh voltage line 137, and the eighth voltage line 139 may be placed in each or in at least one of the second region AREA2 and the third region AREA3.

A first voltage line wiring width W1a which represents a wiring width of the first voltage line 131-1, a second voltage line wiring width W1b which represents a wiring width of the second voltage line 131-2, an eighth voltage line wiring width W4 which represents a wiring width of the eighth voltage line 139, a third voltage line wiring width W5 which represents a wiring width of the third voltage line 133, a fourth voltage line wiring width W2a which represents a wiring width of the fourth voltage line 135-1, a fifth voltage line wiring width W2b which represents a wiring width of the fifth voltage line 135-2, a sixth voltage line wiring width W2c which represents a wiring width of the sixth voltage line 135-3, and a seventh voltage line wiring width W3 which represents a wiring width of the seventh voltage line 137, may be collectively represented as a wiring width W.

In at least one example embodiment, at least two or more of the first voltage line wiring width W1a, the second voltage line wiring width W1b, the eighth voltage line wiring width W4, the third voltage line wiring width W5, the fourth voltage line wiring width W2a, the fifth voltage line wiring width W2b, the sixth voltage line wiring width W2c, and the seventh voltage line wiring width W3 may be equal to each other.

Each or at least one of the first voltage line 131-1 and the second voltage line 131-2 may receive the first voltage VDD1 output from the PMIC 400, and transmit the first voltage VDD1 to the control logic circuit 220 of the source driver IC 200. The eighth voltage line 139 may receive the second voltage VDD2 output from the PMIC 400 and transmit the second voltage VDD2 to the output circuit 260 of the source driver IC 200. The third voltage line 133 may receive the third voltage VDD3 output from the PMIC 400 and transmit the third voltage VDD3 to the data processing interface 240 of the source driver IC 200.

Each of the voltage lines 135-1, 135-2, and 135-3 may receive the first ground voltage VSS1 supplied from the PMIC 400 and transmit the first ground voltage VSS1 to each or at least one of the control logic circuit 22.0 of the source driver IC 200 and the data processing interface 240. The seventh voltage line 137 may receive the second ground voltage VSS2 supplied from the PMIC 400 and transmit the second ground voltage VSS2 to the output circuit 260 of the source driver IC 200.

A ratio of a first sum of an area of the plurality of voltage lines 131-1, 131-2, 133-, 135-1, 135-2, 135-3, 137, and 139 included in the first region AREA1, the second region AREA2, and the third region AREA3 and an area of other voltage lines 138 to a second sum of an area of the first region AREA1, an area of the second region AREA2, and an area of the third region AREA3 is about 0.7 or greater and about 0.996 or less. For example, a wiring width of each of other voltage lines 138 is less than the wiring width W. For example, the wiring width of the other voltage lines 138 may be about 10% of the wiring width W; however, it is not limited thereto. The second operational voltage VDD2 may be supplied to each or at least one of the other voltage lines 138.

The wiring width W may be about 200 μm or greater and about 230 μm or less. A sum of the wiring widths of the voltage lines 131-2, 133, 135-2, and 135-3 included in the first region AREA1 is less than a height H of the film circuit board 120. A sum of the wiring widths of the voltage lines 131-1, 135-1, 137, and 139 included in the second area AREA2 is less than the height H of the film circuit board 120. A sum of the wiring widths of the voltage lines 131-1, 135-1, 137, and 139 included in the third region AREA is less than the height H of the film circuit board 120.

The wiring width W may be uneven. In particular, each of the fourth voltage line wiring width W2a and the seventh voltage line wiring width W3 included in the second region AREA2 may be uneven. Each of a terminal TM2 of the fourth voltage line wiring width W2a and a terminal TM1 of the seventh voltage line wiring width W3 may be the widest. Voltage lines placed in the third region AREA3 may be symmetrical with respect to voltage lines placed in the second region AREA2 around the first region AREA1.

FIG. 5A, FIG. 5B, FIG. 5C and FIG. 5D show example embodiments in which a voltage line illustrated in FIG. 4 and a bump are connected. A voltage line 130 in FIG. 5A, FIG. 5B, FIG. 5C, and FIG. 5D may represent one of the voltage lines 131-1, 131-2, 139, 133, 135-1, 135-2, 135-3, and 137. The voltage line 130 may include edges VEDGE1 and VEDGE2 which are substantially parallel to each other. The voltage line 130 may transmit the voltage VDD1, VDD2, VDD3, VSS1, or VSS2 to the source driver IC 200 through the bump 140.

Figure 5A:
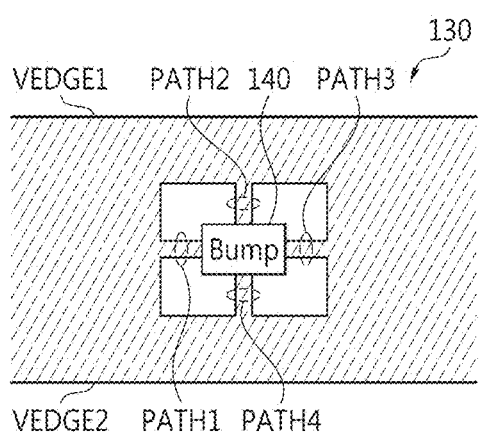
FIG. 5A, FIG. 5B, FIG. 5C and FIG. 5D show example embodiments in which a voltage line illustrated in FIG. 4 and a bump are connected.

Referring to FIG. 5A, FIG. 5B, FIG. 5C, and FIG. 5D, the voltage line 130 may be connected to the bump 140 through at least two or more paths. Referring to FIG. 5A, the bump 140 may be connected to the voltage line 130 through four paths PATH1, PATH2, PATH3, and PATH4.

Figure 5B:
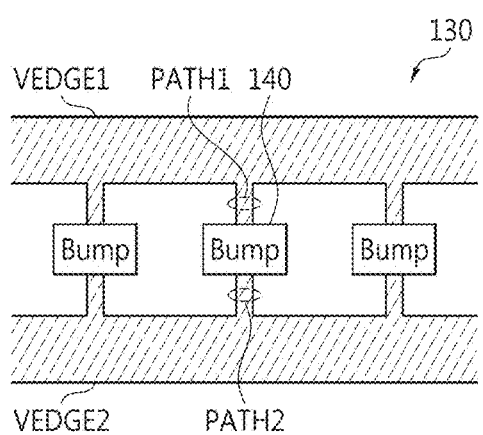
Figure 5C:
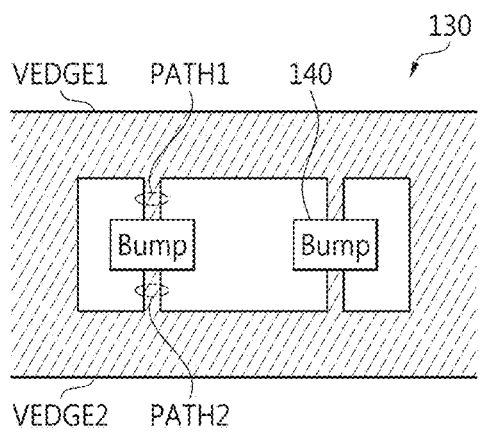

Referring to FIG. 5B and FIG. 5C, the bump 140 may be connected to the voltage line 130 through two paths PATH1 and PATH2.

Figure 5D:
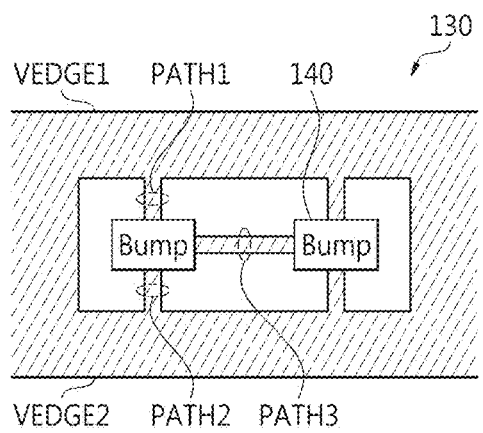

Referring to FIG. 5D, each bump 140 may be connected to the voltage line 130 through two paths PATH1 and PATH2, and the bumps 140 may be connected to each other through path PATH3. The structure of each of the paths PATH1, PATH2, PATH3, and PATH4 may be the same as the structure of the voltage line 130. For example, the voltage line 130 may be embodied or housed in a metal such as copper.

The number of paths which connect the voltage line 130 and the bump 140, a shape of the paths, and a direction of the paths are illustrated in FIG. 5A, FIG. 5B, FIG. 5C, and FIG. 5D; however, it is not limited thereto.

Figure 6:
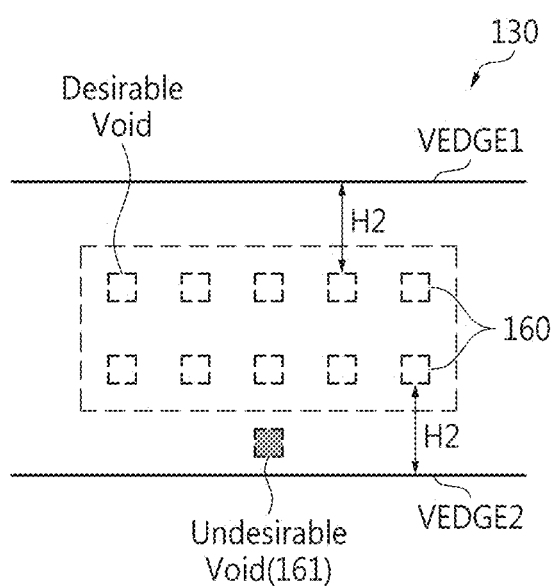
FIG. 6 is a drawing illustrating a void formed between a voltage line illustrated in FIG. 4 and a film.

FIG. 6 is a drawing which illustrates a void formed between a voltage line illustrated in FIG. 4 and a film. Referring to FIG. 6, a plurality of voids 160 may be formed between the voltage line 130 and a film of the film circuit board 120. The plurality of voids 160 may be formed when the voltage line 130 is placed (or formed) on the film.

The voids formed between the voltage line 130 and the film of the film circuit board 120 may include the plurality of voids 160 intentionally formed and at least one void 161 which is naturally or unintentionally formed when the voltage line 130 is placed (or formed) on the film.

The plurality of voids 160 intentionally formed may be arranged periodically between the voltage line 130 and a film of the film circuit board 120; however, example embodiments are not limited thereto. A reason for arranging the plurality of voids 160 periodically is to reduce the probability of generation of at least one unintentionally created void 161.

A distance H2 between each or at least one of the voids 160 placed closest to the first edge VEDGE1 or to the second edge VEDGE2 and the first edge VEDGE1 or the second edge VEDGE2 may be about 60 μm or less; however, example embodiments are not limited thereto. The plurality of voids 160 may be placed in one or more rows, and a distance between two adjacent rows may be about 60 μm or less; however, example embodiments are not limited thereto.

A film circuit board used in a source driver IC according to an example embodiment of the inventive concepts may shield EMI occurring in the source driver IC or may reduce a voltage drop in a voltage line placed on the film circuit board, thereby reducing the EMI.

Although example embodiments of the inventive concepts have been illustrated and described, it will be appreciated by those skilled in the art that changes may be made in these example embodiments without departing from the principles and spirit of the general inventive concepts, the scope of which is defined in the appended claims and their equivalents.

What is claimed is:

1. A chip on film circuit board comprising:
a film circuit board including a first edge and a second edge each extending in a first direction;
a source driver integrated circuit (IC) connected to a plurality of voltage lines located on the film circuit board,
wherein a ratio of an area including the plurality of voltage lines to a film area of the film circuit board is about 0.7 or greater and about 0.996 or less.

2. The chip on film circuit board of claim 1, wherein a width W of at least one of the plurality of voltage lines is 200 μm≤W≤230 μm.

3. The chip on film circuit board of claim 1, wherein
the first operational voltage is less than the second operational voltage, and
the third operational voltage is substantially equal to the first operational voltage.

4. The chip on film circuit board of claim 1, further comprising:
a first ground line configured to supply a ground voltage to at least one of the control logic circuit and the data processing interface; and
a second ground line configured to supply the ground voltage to the output circuit;
wherein at least one of a width of the first ground line and a width of the second ground line are uneven.

5. The chip on film circuit board of claim 1, further comprising:
a first ground line configured to supply a ground voltage to at least one of the control logic circuit and the data processing interface; and
a second ground line configured to supply the ground voltage to the output circuit;
wherein a first width of a terminal portion of the first ground line is larger than widths of other portions of the first ground line, and a second width of a terminal portion of the second ground line is larger than widths of other portions of the second ground line.

6. The chip on film circuit board of claim 1, wherein the chip on film circuit board further defines a plurality of regularly spaced voids between at least one of the plurality of voltage lines and a film of the film circuit board.

7. The chip on film circuit board of claim 6, wherein
at least one of the plurality of voltage lines further includes a third edge and a fourth edge which are substantially parallel to each other, and
a distance between at least two of the voids closest to the third edge or to the fourth edge is about 60 μm or less.

8. The chip on film circuit board of claim 1, further comprising:
a first bump configured to connect the source driver IC and the film circuit board,
wherein the first bump is connected to at least one of the plurality of voltage lines through at least two paths.

9. The chip on film circuit board of claim 8, further comprising:
a second bump connecting the source driver IC and the film circuit board,
wherein the first bump and the second bump are electrically connected to each other through a path.

10. A display device comprising:
a display panel; and
a chip on film circuit board connected to the display panel, wherein the chip on film circuit board includes,
a film circuit board; and
a source driver IC connected to a plurality of voltage lines located on the film circuit board and drive pixels included in the display panel, wherein the source driver IC includes: a control logic; a data processing interface configured to process data according to the control logic; an output circuit configured to output data processed by the data processing interface to a display panel; a first ground line configured to supply a ground voltage to at least one of the control logic circuit and the data processing interface; and a second ground line configured to supply the ground voltage to the output circuit, wherein a first width of a terminal portion of the first ground line is larger than widths of other portions of the first ground line, and a second width of a terminal portion of the second ground line is larger than widths of other portions of the second ground line,
wherein a ratio of an area including the plurality of voltage lines to a film area of the film circuit board is about 0.7 or greater and about 0.996 or less.

11. The display device of claim 10, wherein a width W of at least one of the plurality of voltage lines is 200 μm≤W≤230 μm.

12. The display device of claim 10, further comprising:
a bump configured to connect the source driver IC and the film circuit board,
wherein the bump is connected to at least one of the plurality of voltage lines through at least two paths.

13. The display device of claim 10, wherein the chip on film circuit board further defines a plurality of regularly spaced voids between at least two of the plurality of voltage lines and a film of the film circuit board.

14. A chip on a film circuit board comprising:
a source driver integrated circuit connected to a plurality of voltage lines located on a film circuit board; and
the chip on film circuit board defining a plurality of voids between at least one of the plurality of voltage lines and a film of the film circuit board;

wherein the source driver IC includes: a control logic; a data processing interface configured to process data according to the control logic; an output circuit configured to output data processed by the data processing interface to a display panel; a first ground line configured to supply a ground voltage to at least one of the control logic circuit and the data processing interface; and a second ground line configured to supply the ground voltage to the output circuit, wherein a first width of a terminal portion of the first ground line is larger than widths of other portions of the first ground line, and a second width of a terminal portion of the second ground line is larger than widths of other portions of the second ground line, and a ratio of an area including the plurality of voltage lines to an area of the film circuit board being about 0.7 or greater and about 0.996 or less.

15. The chip on film circuit board of claim 14, wherein a width of at least one of the plurality of voltage lines is between about 200 μm and about 230 μm.

16. The chip on film circuit board of claim 14, further comprising:
a first bump configured to connect the source driver integrated circuit and the film circuit board, the first bump being connected to at least one of the plurality of voltage lines through at least two paths.

17. The chip on film circuit board of claim 14, wherein the plurality of voids are regularly spaced; and
a largest distance between two of the voids is about 60 μm or less.

* * * * *